United States Patent [19]

Szmanda

[11] Patent Number: 4,462,860

[45] Date of Patent: Jul. 31, 1984

[54] END POINT DETECTION

[75] Inventor: Charles R. Szmanda, Bethlehem, Pa.

[73] Assignee: AT&T Bell Laboratories, Murray Hill, N.J.

[21] Appl. No.: 451,029

[22] Filed: Dec. 20, 1982

Related U.S. Application Data

[63] Continuation-in-part of Ser. No. 381,148, May 24, 1982, abandoned.

[51] Int. Cl.³ .................................. H01L 21/306
[52] U.S. Cl. .................................. 156/626; 430/30; 430/311; 356/448; 356/357; 356/381; 356/382
[58] Field of Search .................. 430/30, 311, 329; 156/626, 627; 354/298; 356/436, 441, 448, 357, 358, 381, 382, 355, 378; 364/566, 803

[56] References Cited

U.S. PATENT DOCUMENTS

| | | | |
|---|---|---|---|
| 4,136,940 | 1/1979 | Lin | 354/298 |
| 4,142,107 | 2/1979 | Hatzakis et al. | 430/30 |
| 4,147,435 | 4/1979 | Habeggar | 356/357 |
| 4,198,261 | 4/1980 | Busta et al. | 156/626 |
| 4,201,579 | 5/1980 | Robinson et al. | 156/626 |
| 4,208,240 | 6/1980 | Latos | 156/627 |
| 4,260,259 | 4/1981 | Kirk | 356/357 |
| 4,317,698 | 3/1982 | Christol et al. | 156/626 |
| 4,367,044 | 1/1983 | Booth, Jr. et al. | 356/357 |
| 4,377,436 | 3/1983 | Donnelly et al. | 156/626 |

OTHER PUBLICATIONS

Newman, Roger, "Fine Line Lithography," Rockwell International, Anaheim, Calif., 1980, pp. 213-214.

Primary Examiner—John Kittle
Assistant Examiner—José G. Dees
Attorney, Agent, or Firm—Peter V. D. Wilde

[57] ABSTRACT

The clearing point of photoresist development is detected automatically by illuminating the developing photoresist surface with intense monochromatic light. Interfering reflection from the resist-substrate interface and the fast eroding and slow eroding resist surfaces produces fast and slow oscillatory signals. These signals are processed to produce a logical output indicative of the cessation of the fast oscillations in the presence of the continuing slow oscillations signaling the clearing point of development.

2 Claims, 7 Drawing Figures

END POINT DETECTION

CROSS REFERENCE TO RELATED APPLICATION

This application is a continuation-in-part of my copending application, Ser. No. 381,148, filed May 24, 1982 now abandoned.

TECHNICAL FIELD

This invention relates to semiconductor device fabrication and particularly to a method for detecting changes in thickness of thin film layers. Typically these changes occur during etching of the thin film and typically there is a need for detecting a point which can be used for determining when the film is removed. Changes according to this invention can also be used to detect the rate of removal of the thin film material. The rate can be then used to determine the processing time required to remove a film of a given thickness. This expedient is useful to account for variations in etching rates that arise due to minor changes in processing conditions.

BACKGROUND OF THE INVENTION

A variety of optical techniques has been proposed for detecting the end point of etching process. Observing changes in reflectivity of the layer being etched is described in U.S. Pat. No. 4,198,261. A technique using interference effects is described in Chapter 2, page 213, of *Fine Line Lithography,* North Holland Publishing Company (1980). These methods and other optical methods share the common requirement of directing the light used for the measurement onto the layer being processed. In modern semiconductor processing that layer can be represented by a very small feature size. Difficulty is then encountered in focusing the analyzing beam to the size of the feature and/or addressing that feature. A possible solution is to use a beam with an aperture larger than the feature. In that case, a change attributable to that feature will be detectable although the optical effect being measured will be masked to the extent of the portion of the beam that is incident on a feature or features where no optical change is occurring will exhibit no change. More severe problems arise when different parts of the region on which the beam is incident are changing in different ways e.g. where the process is an etching process and the beam is incident on portions having different etch rates. The following description is focused on this exemplary case. However, other applications can be envisioned which will make advantageous use of the teachings described here. In like vein, this description relates to differential etch rates between exposed and unexposed photoresist material. This is but one example of materials having different properties, which can be either physical or chemical, that cause them to behave differently under a given set of conditions.

Recognizing that this is exemplary the following background is relevant.

Techniques for detection of the completion of thin layer removal largely have been visual and empirical. An optical technique using the interference of reflected light for detecting the photoresist development endpoint is described in the reference noted above.

However, as line width requirements for semiconductor integrated circuit fabrication become more stringent, the need for more precise photoresist masks increases. More accurate determination of end-point development is essential to avoid overetching and consequent loss of definition.

Accordingly, an embodiment of this invention is a more accurate method of determining the end-point in the development of photoresist coatings. It is a more accurate end-point determination technique which is automatic and does not depend on operator judgment.

The detection of the removal of a thin layer during an etching process is commonly referred to as "end point" detection. Typically this defines the point in time at which the layer underlying the layer being etched first becomes exposed. This may or may not signal the end of the etching operation. Often, etching is continued beyond the point of first exposure to allow clearing of the entire area that is to be removed. In these cases the so-called "end point" is actually an indicator of an intermediate point in the etching operation. A consequence of this can be a more accurate etching process since detecting the progress of the etching process allows for anticipation of the conclusion of the process and there is no error due to continued etching while the process is being turned off as would be the case when the ultimate end of the process is detected.

SUMMARY OF THE INVENTION

The end point of an etching operation is detected in accordance with the invention by directing a beam of electromagnetic radiation, typically light, onto regions of the assembly being processed. The regions on which the analyzing radiation is incident exhibit at least two rates of change, under the conditions of the process. Additionally, the materials are sufficiently transparent to the analyzing radiation to provide reflections of the radiation from the surface underlying the layer being processed, which corresponds approximately to the lower surface of the layer being processed, as well as reflections from the top surface of the layer. These two reflections combine in the reflected beam to provide an interference effect that changes in accordance with certain characteristics of the layer. The main effect of interest is the physical thickness of the layer. Other effects, e.g. changes on refractive index, or polarization, may be detected as well.

The fluctuation in the dual interference effects are used in accordance with the invention to determine the change in the single property of interest by relative measurement of the rapidly varying signal.

In a specific embodiment in accordance with the invention, the surface of a photoresist coating on a semiconductor body undergoing development is subjected to a beam of intense monochromatic light. The light illuminates portions of both exposed and unexposed photoresist which are being eroded at distinctly different rates. Light reflected from the surface of the semiconductor body interferes with light reflected from the surface of both the rapid eroding and the slow eroding photoresist surfaces. The intensity of this reflected light has an oscillatory character as a function of time. The faster eroding surface gives rise to a faster oscillation than that exhibited by the more slowly eroding unexposed photoresist portion. The occurrence of the clearing point, corresponding to the removal of the bulk of the exposed resist, is signaled by the cessation of the fast oscillations in the presence of the continuing slower oscillations.

The detection of this cessation is accomplished in accordance with the invention by logic circuit means which compute in analog fashion the first, second, and third time derivatives of the reflected light signal. The circuit is designed so that the fast oscillations are detected selectively in the presence of the slower oscillations. Since the second and third analog derivatives of an oscillating signal of suitable frequency are out of phase with one another, they will be zero simultaneously, within some voltage range, 6, only when the fast oscillations cease. The clearing point is indicated by the circuit with a logical "true" signal. Thus, a control computer is programmed to monitor a digital line and note when the output indicates "true" signaling the clearing point of the development process.

Thus, a feature of the invention is an end-point detection process which is completely automatic and unempirical.

BRIEF DESCRIPTION OF THE DRAWINGS

The invention and its other objects and features will be more clearly understood from the following detailed description taken in conjunction with the drawings in which.

DETAILED DESCRIPTION

Apparatus for the practice of the invention consists basically in a source of monochromatic light of sufficient intensity to provide sufficiently strong reflectivity from the photoresist-coated surface of a semiconductor wafer to produce distinct signals. Although not shown, such apparatus may comprise a laser light source and a standard photosensitive diode or diodes. To provide an averaging effect, a plurality of photodetectors which scan a greater portion of the surface may be used.

Figure 1:
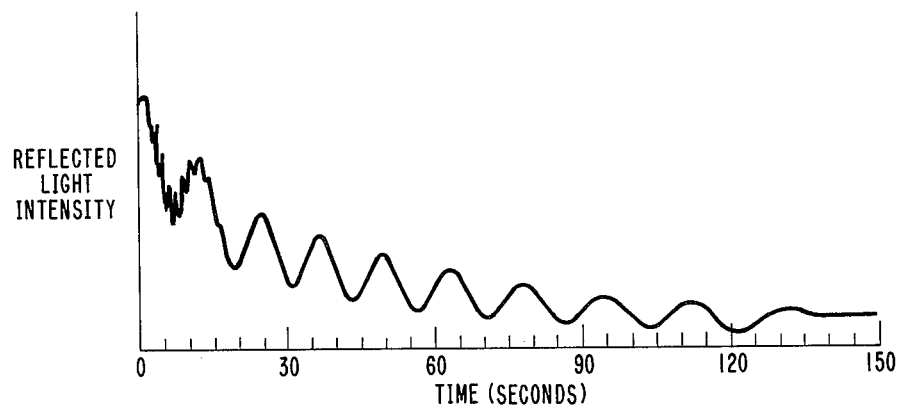
FIGS. 1 and 2 are graphs of reflected light intensity versus time illustrating the development process.

Procedurally, once the photoresist-coated wafer has been exposed, it is immersed in a developer solution and while therein, is subjected to the monochromatic light beam, and the photodetector pickup is transformed into an electrical signal having the general form as shown in FIG. 1, which is a plot of reflected light intensity versus time. It is known that the intensity of the reflected light from a photoresist-coated surface during development exhibits time oscillations because reflections from the surface of the photoresist interfere constructively or destructively with those from the underlying substrate, depending on the thickness of the developing photoresist layer. Since both the exposed and unexposed portions of the photoresist are eroded by the developer solution at different rates, two distinct oscillations are observed, as shown in the curve of FIG. 1. In this curve, the fast oscillations, at the left, which result from the thinning of the exposed resist, are superimposed on a set of much slower oscillations which are indicative of the erosion of unexposed resist. The occurrence of the clearing point, which is the instant at which sufficient semiconductor surface is bared of photoresist to cause the disappearance of one set of reflective interferences and correspondingly denotes removal of the bulk of the exposed photoresist, is indicated by the cessation of the fast oscillations in the presence of the slow. Circuit means for detecting this event are illustrated in FIGS. 5, 6, and 7.

Figure 5:
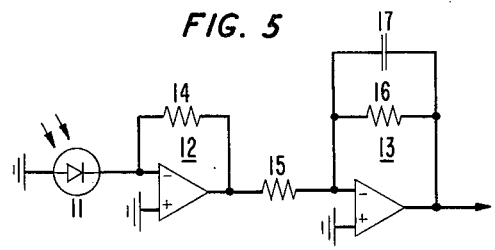
FIGS. 5, 6, and 7 are circuit schematics of an arrangement for processing the light signals and indicating the end-point by a logic output.

The circuit of FIG. 5 includes the photodetector 11 upon which the light reflected from the photoresist surface impinges. The element 12 is a preamplifier stage which is connected to the element 13 which functions as an AC noise filter and provides further amplification.

Figure 6:
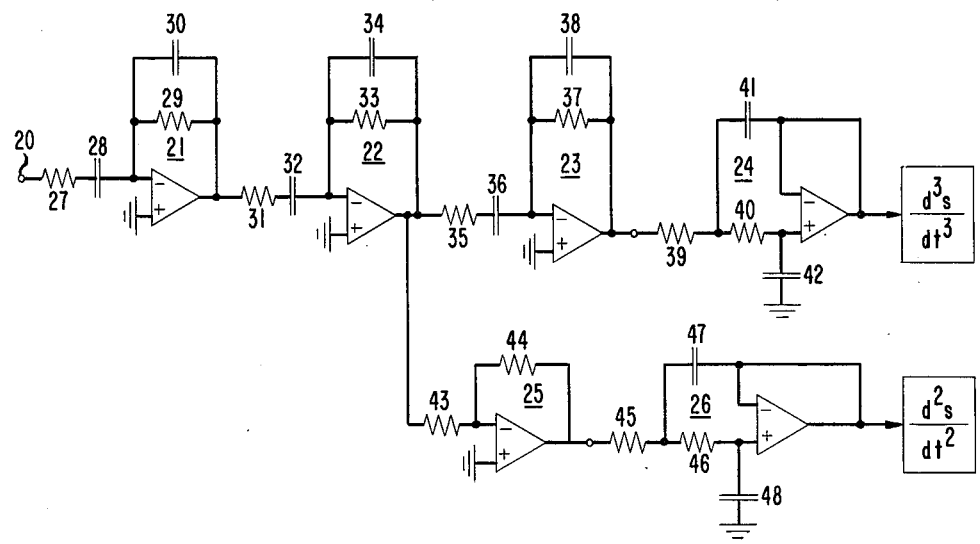

The amplified signal from the output of the circuit of FIG. 5 is fed to the input 20 of the circuit of FIG. 6. This circuit comprises the first differentiation stage comprising the element 21 coupled to the second differentiation stage comprising the element 22. Elements 23 and 24 are the third differentiation stage and a final low-pass filter, respectively. Elements 25 and 26 are a ten-to-one amplifier and a low-pass filter in this particular embodiment.

Figure 7:
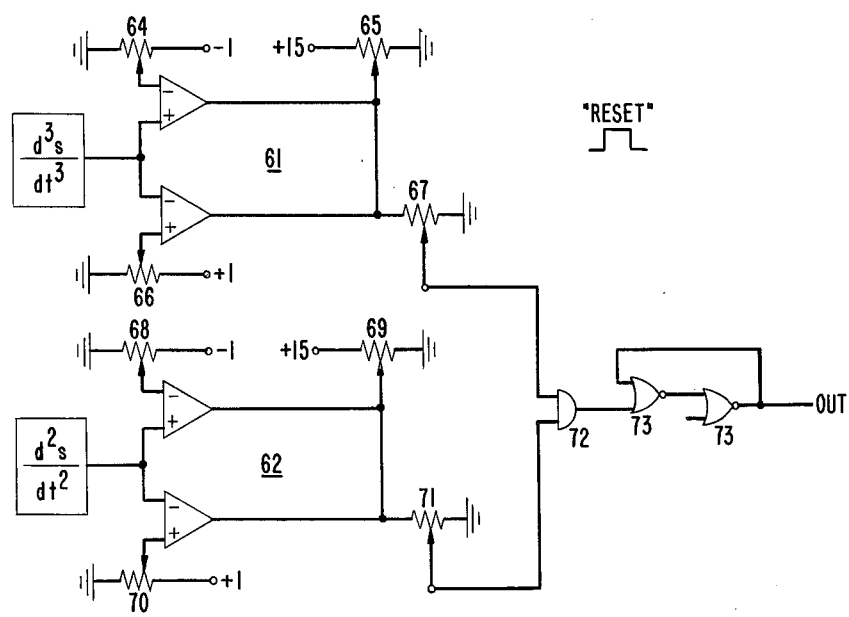

The circuit of FIG. 7 comprises two window comparators, the outputs of which are fed to an AND gate. As previously stated, since the second and third analog derivatives are out of phase with one another, they will be simultaneously zero, within some voltage range, 6, only when the fast oscillations cease. Accordingly, the comparators composed of stages 61 and 62 serve to determine from the analog derivatives the existence of the 6, which is fed to AND gate 72 and NOR gates 73 which indicate the clearing point by the occurrence of an output.

In a specific embodiment, the circuits in accordance with FIGS. 5, 6, and 7 included the following elements: (1) Western Electric 559C Operational Amplifier; (2) Western Electric 41FP AND gates; (3) Western Electric NOR 41EE.

| Resistors - Value In Ohms | | |
|---|---|---|
| 14-1 MEG | 39-100K | 67-5K |
| 15-100K | 40-100K | 68-200 |
| 16-250K | 43-10K | 69-5K |
| 27-4.75K | 44-100K | 70-200 |
| 29-402K | 45-100K | 71-5K |
| 31-4.75K | 46-100K | |
| 33-100K | 64-200 | |
| 35-10K | 65-5K | |
| 37-402K | 66-200 | |

| Capacitors - Value In Microfarads |
|---|
| 17 - 0.01 |
| 28 - 4 |
| 30 - 0.022 |
| 32 - 4 |
| 34 - 0.022 |
| 36 - 4 |
| 38 - 0.04 |
| 41 - 1 |
| 42 - 1 |
| 47 - 1 |
| 48 - 1 |

Figure 2:
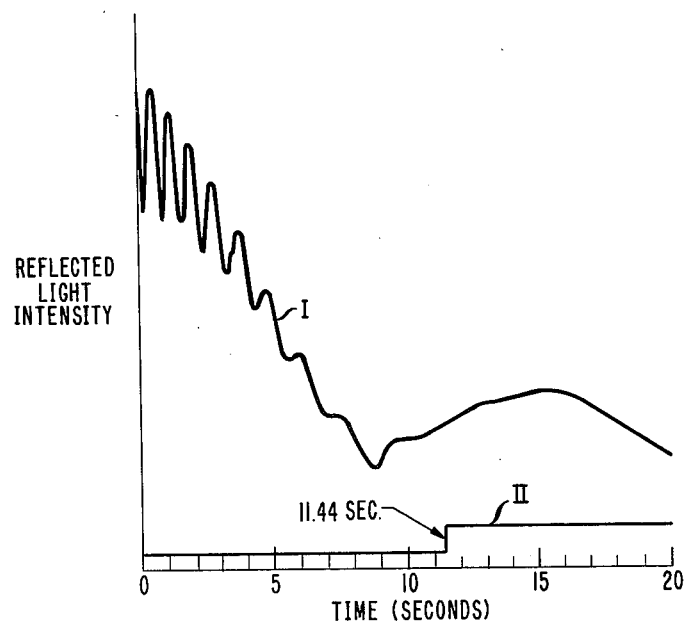

FIG. 2 shows a typical raw reflected light signal in curve I in which the fast oscillations are superimposed on an irregular baseline. The rectilinear graph II is the logical signal produced by the circuit means just described, with the occurrence of the TRUE indication represented by the change in level at 11.44 seconds elapsed time.

In general, low frequency oscillations, which arise from the erosion of the unexposed photoresist and constitute a formidable baseline in the raw signal, do not interfere with the determination of the clearing point.

Figure 3:
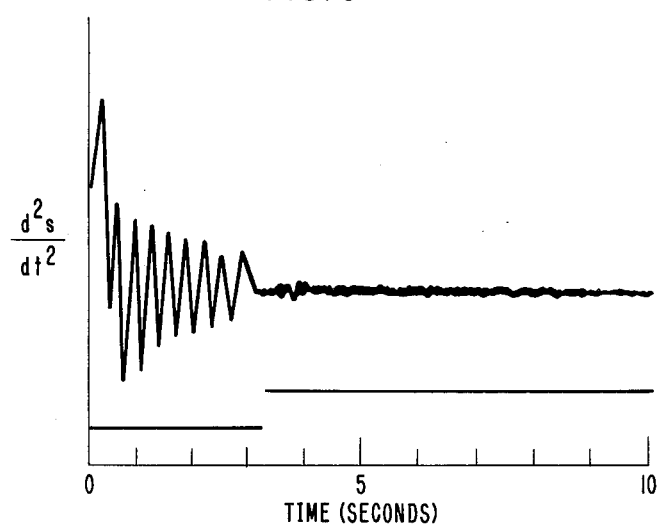
FIGS. 3 and 4 are graphs of second and third derivatives of the light signals with time.
Figure 4:
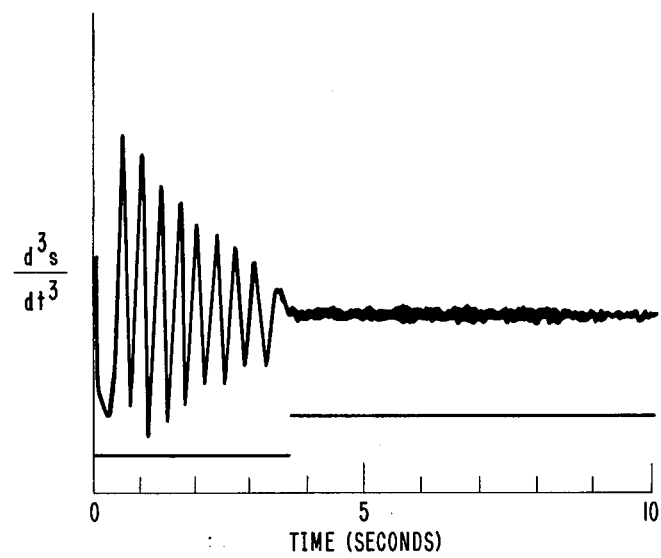

FIG. 3 shows the second derivative signal and FIG. 4 the third derivative signal, each from light reflected from different locations on the same wafer showing that both signals indicate substantially the same time to reach the clearing point.

After the clearing point has been detected, the end-point is determined by a factor determined largely by factors relating to the character and geometry of the resist pattern. Typically, the total development time to end-point would be 1-2 times the time to the clearing point.

Accordingly, there is provided an arrangement for accurately and automatically detecting the end-point of the photoresist development process, thereby avoiding particularly overetching which tends to degrade the definition of photoresist masks.

It is expected that the processes described herein will find use as important parts of a device technology and will become economically significant additions to manufacturing operations. Thus the invention as claimed herein is not regarded as a testing procedure per se but as an important step in a manufacturing process in the same way that etching, implantation, chemical deposition and other processes are important steps in manufacturing microminiature devices.

The reference herein to different materials is meant to describe materials that are either chemically or physically different. Such materials may be different as the result of selectively induced changes in layers initially of the same material, as in the examples given above.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. A method for manufacture of a microminiature device which includes the steps of forming a patterned layer by removing a thin film portion of a first material from an underlying support body in the presence of an adjacent region of a second material on the support body with said materials having different removal rates, and determining the removal of the first material by directing a light beam on the material and measuring a change in the reflected beam, the invention characterized in that:
   a. the beam has a size substantially greater than the thin film portion of the first material upon which it is incident and is incident on substantial portions of the second material,
   b. the regions of the second material that form the pattern in the patterned layer correspond to one or more features of the microminiature device, and
   c. both the first and second materials have finite removal rates and the removal rates of both materials are sufficient to produce oscillations in the portion of the beam reflected from said adjacent region.

2. The method of claim 1 in which the reflected beam is converted to an analog electrical signal, the second and third analog derivatives of the electrical analog signal are derived electrically, and the selective process is terminated at a point dependent on the point at which the second and third derivatives are essentially zero.

* * * * *

UNITED STATES PATENT AND TRADEMARK OFFICE
CERTIFICATE OF CORRECTION

PATENT NO. : 4,462,860
DATED : July 31, 1984
INVENTOR(S) : Charles R. Szmanda

It is certified that error appears in the above-identified patent and that said Letters Patent is hereby corrected as shown below:

Column 2, line 44, "on" should read --in--. Column 3, line 10, "6" should read --$\delta$--. Column 4, line 21, "6" should read --$\delta$--; column 4, line 25, "6" should read --$\delta$--.

Signed and Sealed this

Second Day of April 1985

[SEAL]

Attest:

DONALD J. QUIGG

Attesting Officer
Acting Commissioner of Patents and Trademarks